United States Patent
Toyoda et al.

(10) Patent No.: US 11,996,043 B2
(45) Date of Patent: May 28, 2024

(54) DISPLAY DEVICE TO SUPPRESS DETERIORATION OF AN IMAGE

(71) Applicant: SONY SEMICONDUCTOR SOLUTIONS CORPORATION, Kanagawa (JP)

(72) Inventors: Takashi Toyoda, Kanagawa (JP); Shun Ishijima, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/997,226

(22) PCT Filed: Apr. 15, 2021

(86) PCT No.: PCT/JP2021/015575
§ 371 (c)(1),
(2) Date: Oct. 26, 2022

(87) PCT Pub. No.: WO2021/225064
PCT Pub. Date: Nov. 11, 2021

(65) Prior Publication Data
US 2023/0178020 A1    Jun. 8, 2023

(30) Foreign Application Priority Data

May 7, 2020   (JP) ................................. 2020-081984

(51) Int. Cl.
*G09G 3/3233* (2016.01)
*H10K 59/35* (2023.01)

(52) U.S. Cl.
CPC ... *G09G 3/3233* (2013.01); *G09G 2300/0814* (2013.01); *G09G 2300/0852* (2013.01);
(Continued)

(58) Field of Classification Search
CPC ......... G09G 3/3233; G09G 2300/0814; G09G 2300/0852; G09G 2320/0233;
(Continued)

(56) References Cited

U.S. PATENT DOCUMENTS

| 11,587,489 B2 * | 2/2023 | Zhou | G09G 3/2003 |
| 2010/0060806 A1 * | 3/2010 | Ina | G09G 3/3688 |
| | | | 348/791 |

(Continued)

FOREIGN PATENT DOCUMENTS

| JP | 2003-076334 A | 3/2003 |
| JP | 2011-221255 A | 11/2011 |

(Continued)

OTHER PUBLICATIONS

International Search Report and Written Opinion of PCT Application No. PCT/JP2021/015575, dated Jun. 22, 2021, 08 pages of ISRWO.

*Primary Examiner* — Rodney Amadiz
(74) *Attorney, Agent, or Firm* — CHIP LAW GROUP

(57) ABSTRACT

Deterioration of an image is suppressed. A display device includes: pixels including a plurality of light emitting units that emits light of each of a plurality of colors; a pixel array in which the pixels are arranged in an array of pixel lines along a line in a first direction and pixel columns along a column in a second direction intersecting the first direction; a signal line connected to the pixels belonging to the pixel array in the second direction; and a selector circuit connected between a predetermined number of the pixel columns and the signal line. The signal line applies, via the selector circuit, a light emission signal provided in time series to the light emitting units of each color of the pixels, the selector circuit time-divides the light emission signal provided in time series from the signal line into the predetermined number of columns, the light emission signal is (Continued)

distributed to the pixels in the same order for each color in the same order in the same pixel line, and the light emission signal is distributed to the pixels in different orders for each line for each color in the same order in two adjacent pixel lines.

8 Claims, 12 Drawing Sheets

(52) U.S. Cl.
CPC ............... *G09G 2320/0233* (2013.01); *G09G 2320/0626* (2013.01); *H10K 59/351* (2023.02)

(58) Field of Classification Search
CPC ......... G09G 2320/0626; G09G 3/2003; G09G 2300/0819; G09G 2300/0861; G09G 2310/0213; G09G 2310/0297; G09G 2320/0209; G09G 3/3266; H10K 59/351; G09F 9/30

See application file for complete search history.

(56) References Cited

U.S. PATENT DOCUMENTS

2019/0347976 A1   11/2019  Um et al.
2019/0355311 A1*  11/2019  Ota ...................... G09G 3/3266

FOREIGN PATENT DOCUMENTS

| | | |
|---|---|---|
| JP | 2012-233950 A | 11/2012 |
| JP | 2015-034861 A | 2/2015 |
| JP | 2019-200363 A | 11/2019 |

* cited by examiner

FIG. 8

FIRST DISTRIBUTION

| | | B10 | R11 | G11 | B11 | R12 | G12 | B12 | R13 | G13 | B13 | R14 | G14 | B14 | R15 |
|---|---|---|---|---|---|---|---|---|---|---|---|---|---|---|---|
| t01 | S01 | | 1 | | | | | | | | | | | | 1 |
| t02 | S02 | | | | | 2 | | | | | | | | | |
| t03 | S03 | | | | | | | | 3 | | | | | | |
| t04 | S04 | | | | | | | | | | | 4 | | | |
| t05 | S05 | | ⇐ 5 | | | | | | | | | | | | |
| t06 | S06 | | | | | ⇐ 6 | | | | | | | | | |
| t07 | S07 | | | | | | | | ⇐ 7 | | | | | | |
| t08 | S08 | | | | | | | | | | | ⇐ 8 | | | |
| t09 | S09 | | ⇐ 9 ⇒ | | | | | | | | | | | | |
| t10 | S10 | | | | | ⇐ 10 ⇒ | | | | | | | | | |
| t11 | S11 | | | | | | | | ⇐ 11 ⇒ | | | | | | |
| t12 | S12 | 12 ⇒ | | | | | | | | | | ⇐ 12 ⇒ | | | |

SECOND DISTRIBUTION

| t | S | B20 | R21 | G21 | B21 | R22 | G22 | B22 | R23 | G23 | B23 | R24 | G24 | B24 | R25 |
|---|---|---|---|---|---|---|---|---|---|---|---|---|---|---|---|
| t01 | S04 | | | | | | | | | | | 1 | | | |
| t02 | S03 | | | | | | | | 2 | | | | | | |
| t03 | S02 | | | | | 3 | | | | | | | | | |
| t04 | S01 | | 4 | | | | | | | | | | | | 4 |
| t05 | S08 | | | | | | | | | | | ⇐5 | | | |
| t06 | S07 | | | | | | | | ⇐6 | | | | | | |
| t07 | S06 | | | | | ⇐7 | | | | | | | | | |
| t08 | S05 | | ⇐8 | | | | | | | | | | | | |
| t09 | S12 | 9⇒ | | | | | | | | | | | | | ⇐9⇒ |
| t10 | S11 | | | | | | | | | | | ⇐10⇒ | | | |
| t11 | S10 | | | | | ⇐11⇒ | | | | | | | | | |
| t12 | S09 | | | ⇐12⇒ | | | | | | | | | | | | t ↓

FIG. 10

SECOND DISTRIBUTION

| t | S | B20 | R21 | G21 | B21 | R22 | G22 | B22 | R23 | G23 | B23 | R24 | G24 | B24 | R25 |
|---|---|---|---|---|---|---|---|---|---|---|---|---|---|---|---|
| t01 | S03 | | | | | | | | 1 | | | | | | |
| t02 | S04 | | | | | | | | | | | 2 | | | |
| t03 | S01 | | 3 | | | | | | | | | | | | 3 |
| t04 | S02 | | | | | 4 | | | | | | | | | |
| t05 | S07 | | | | | | | | ⇐ 5 | | | | | | |
| t06 | S08 | | | | | | | | | | | ⇐ 6 | | | |
| t07 | S05 | | | ⇐ 7 | | | | | | | | | | | |
| t08 | S06 | | | | | ⇐ 8 | | | | | | | | | |
| t09 | S11 | | | | | | | | | | | ⇐ 9 ⇒ | | | |
| t10 | S12 | 10 ⇒ | | | | | | | | | | | | ⇐ 10 ⇒ | |
| t11 | S09 | | | ⇐ 11 ⇒ | | | | | | | | | | | |
| t12 | S10 | | | | | | ⇐ 12 ⇒ | | | | | | | | | t ↓

FIG. 11

FIRST DISTRIBUTION

| | | B10 | R11 | G11 | B11 | R12 | G12 | B12 | R13 | G13 | B13 | R14 | G14 | B14 | R15 |
|---|---|---|---|---|---|---|---|---|---|---|---|---|---|---|---|
| t01 | S01 | | 1 | | | | | | | | | | | | 1 |
| t02 | S03 | | | | | | | | 2 | | | | | | |
| t03 | S02 | | | | | 3 | | | | | | | | | |
| t04 | S04 | | | | | | | | | | | 4 | | | |
| t05 | S05 | | | ⇐ 5 | | | | | | | | | | | |
| t06 | S07 | | | | | | | | | ⇐ 6 | | | | | |
| t07 | S06 | | | | | | ⇐ 7 | | | | | | | | |
| t08 | S08 | | | | | | | | | | | | ⇐ 8 | | |
| t09 | S09 | | | ⇐ 9 ⇒ | | | | | | | | | | | |
| t10 | S11 | | | | | | | | | | | ⇐ 10 ⇒ | | | |
| t11 | S10 | | | | | | ⇐ 11 ⇒ | | | | | | | | |
| t12 | S12 | 12 ⇒ | | | | | | | | | | | ⇐ 12 ⇒ | | | t

FIG. 12

SECOND DISTRIBUTION

| | | B20 | R21 | G21 | B21 | R22 | G22 | B22 | R23 | G23 | B23 | R24 | G24 | B24 | R25 |
|---|---|---|---|---|---|---|---|---|---|---|---|---|---|---|---|
| t01 | S04 | | | | | | | | | | | 1 | | | |
| t02 | S02 | | | | | 2 | | | | | | | | | |
| t03 | S03 | | | | | | | | 3 | | | | | | |
| t04 | S01 | | 4 | | | | | | | | | | | | 4 |
| t05 | S08 | | | | | | | | | | ⇐5 | | | | |
| t06 | S06 | | | | | ⇐6 | | | | | | | | | |
| t07 | S07 | | | | | | | | | ⇐7 | | | | | |
| t08 | S05 | | ⇐8 | | | | | | | | | | | | |
| t09 | S12 | 9⇒ | | | | | | | | | | | | ⇐9⇒ | |
| t10 | S10 | | | | | ⇐10⇒ | | | | | | | | | |
| t11 | S11 | | | | | | | | | ⇐11⇒ | | | | | |
| t12 | S09 | | | ⇐12⇒ | | | | | | | | | | | | t ↓

DISPLAY DEVICE TO SUPPRESS DETERIORATION OF AN IMAGE

CROSS REFERENCE TO RELATED APPLICATIONS

This application is a U.S. National Phase of International Patent Application No. PCT/JP2021/015575 filed on Apr. 15, 2021, which claims priority benefit of Japanese Patent Application No. JP 2020-081984 filed in the Japan Patent Office on May 7, 2020. Each of the above-referenced applications is hereby incorporated herein by reference in its entirety.

TECHNICAL FIELD

The present disclosure relates to a display device.

BACKGROUND ART

In displays and panels using micro organic light emitting diodes (M-OLEDs), a demultiplexer circuit (selector circuit) is widely used as a driver in a row direction. This is because, as a result of the selector circuit transmitting signals to a plurality of signal lines with one amplifier, reduction in circuit scale can be expected. For example, there is a selector circuit in which twelve output signal lines are connected to one amplifier. The number of signal lines is determined according to various conditions such as capability of the amplifier, addition of signal lines, and time available for writing, but since the number of necessary amplifiers can be reduced as the number of signal lines to be written increases, a selector circuit capable of increasing the number of output signal lines (the number of selectors) within a possible range is desirable. However, as the number of selectors increases, the time for selecting one signal line decreases. Therefore, the number of selectors cannot be unnecessarily increased, and a plurality of selectors is provided in the same row in many cases.

In a case where the selector circuit is used, there is an influence of a signal value from the selected pixel (first pixel) to the adjacent pixel (second pixel). When the second pixel is selected after the first pixel is selected, the influence from the first pixel to the second pixel is canceled, while the influence from the second pixel to the first pixel remains without being canceled. In a case where the selector circuit simply operates from one end to the other end, the pixel selected first is also affected by the most recently selected pixel of the adjacent selector circuit, and the signal value varies. Furthermore, as the performance of the selector circuit itself, the voltage value gradually varies from the pixel selected first to the pixel selected most recently. That is, when the pixel selected first and the pixel selected most recently are compared with each other, in addition to this change in the voltage value, a difference occurs in the variation of the voltage value with respect to the input signal due to the influence from the adjacent pixel. As a result, at the boundary of the selector circuit, there is a column having a streak-like luminance, and this streak is displayed on the display or the like. On the other hand, a method of changing the order of pixel selection in the selector circuit to reduce the influence can be considered, but suppression of further deterioration of a displayed image is desired.

CITATION LIST

Patent Document

Patent Document 1: Japanese Patent Application Laid-Open No. 2011-221255

Patent Document 2: Japanese Patent Application Laid-Open No. 2015-034861

SUMMARY OF THE INVENTION

Problems to be Solved by the Invention

A display device that suppresses deterioration of an image is realized.

Solutions to Problems

According to an embodiment, there is provided a display device including: pixels including a plurality of light emitting units that emits light of each of a plurality of colors; a pixel array in which the pixels are arranged in an array of pixel lines along a line in a first direction and pixel columns along a column in a second direction intersecting the first direction; a signal line connected to the pixels belonging to the pixel array in the second direction; and a selector circuit connected between a predetermined number of the pixel columns and the signal line. The signal line applies, via the selector circuit, a light emission signal provided in time series to the light emitting units of each color of the pixels, the selector circuit time-divides the light emission signal provided in time series from the signal line into the predetermined number of columns, the light emission signal is distributed to the pixels in the same order for each color in the same order in the same pixel line, and the light emission signal is distributed to the pixels in different orders for each line for each color in the same order in two adjacent pixel lines.

A line control circuit that is connected to the pixels of each of the pixel lines and applies a line control signal for controlling light emission of the pixel line to the pixel line may be further provided, and the pixels may emit light on the basis of the line control signal and the light emission signal distributed by the selector circuit.

The selector circuit may execute first distribution in which the light emission signal is distributed in a first order and second distribution in which the light emission signal is distributed in a second order different from the first order, an order of colors in the first order and an order of colors in the second order may be the same, and a selection order of the pixels in the same color in the first order and a selection order of the pixels in the same color in the second order may be different from each other.

The selector circuit may execute distribution such that the pixel lines to which the first distribution is performed and the pixel lines to which the second distribution is performed are alternately arranged.

The first order may be an order of selecting the pixels for all colors in the same order, and the second order may be an order of selecting the pixels for all colors in the same order which is an order different from the first order.

The second order may be an order of selecting the pixels for each color in an order reverse to the first order.

The second order may be an order of selecting the pixels for each color in an order obtained by dividing the first order in two and switching the first and second parts.

The second circuit may be an order of selecting the pixels for each color in an order obtained by cyclically shifting the first order every two pixels.

The second circuit may be an order of selecting the pixels for each color in an order obtained by switching the first order in any manner.

BRIEF DESCRIPTION OF DRAWINGS

FIG. 8 is a diagram showing an example of an order of distribution according to the embodiment.

FIG. 9 is a diagram showing an example of an order of distribution according to the embodiment.

FIG. 10 is a diagram showing an example of an order of distribution according to the embodiment.

FIG. 11 is a diagram showing an example of an order of distribution according to the embodiment.

FIG. 12 is a diagram showing an example of an order of distribution according to the embodiment.

MODE FOR CARRYING OUT THE INVENTION

Hereinafter, aspects of the present disclosure will be described with reference to the drawings. Since the drawings are shown such that the description is easy to understand, the illustrated sizes, size ratios, aspect ratios, shapes, and the like are not limited to the drawings.

Figure 1:
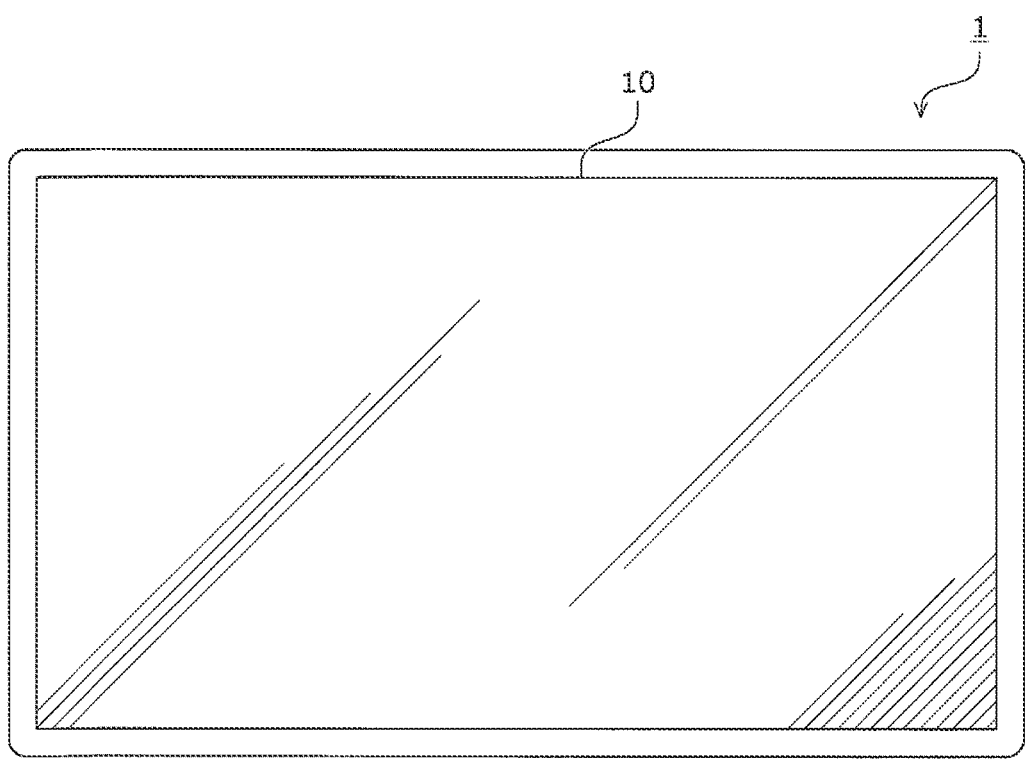
FIG. 1 is a schematic block diagram of a receiving device according to an embodiment.

FIG. 1 is a diagram schematically showing a display device according to an embodiment. The display device 1 includes a display panel 10. The display panel 10 has a surface including a material such as transparent glass, and appropriately displays light emitted from the pixels through various filters and the like. The display panel 10 is a panel that displays an image by light emission of pixels such as an organic EL display. Furthermore, the display panel 10 is, for example, a display that performs raster display by line scanning.

The display device 1 may be a single device such as a monitor of a computer or a TV monitor. Furthermore, as another example, a device integrally formed with an external device such as a digital camera, a mobile phone, a smartphone, a tablet terminal, or a computer with a monitor may be used. The above description has been given as an example, and the display device 1 in the present disclosure can also be used for other purposes.

Figure 2:
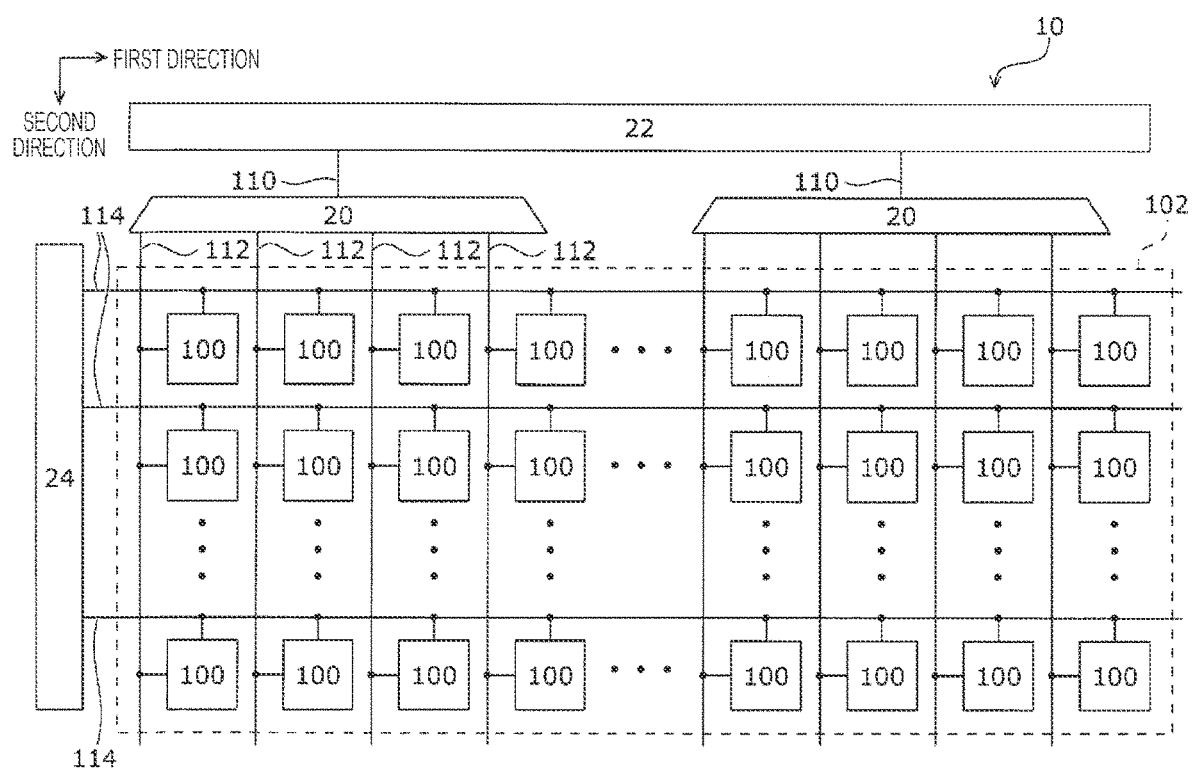
FIG. 2 is a view schematically showing a display panel according to the embodiment.

FIG. 2 is a view showing the inside of the display panel 10. The display panel 10 includes pixels 100 and a pixel array 102. Furthermore, selector circuits 20, a light emission signal transmission circuit 22, and a line control circuit 24, which are circuits for causing the pixels 100 to emit light, are provided.

The pixels 100 include, for example, red, green, blue (RGB) 3-color M-OLEDs as light emitting units, and emit light. The light emitting elements are not limited to the M-OLEDs, and may be other light emitting elements. In addition, the colors may be complementary colors CMY instead of the three colors of RGB, or may be other combinations as long as light for forming an image can be appropriately emitted, such as RGB+white (RGBW). The pixel 100 appropriately emits light when a light emission signal is applied. The light emission signal is applied to each light emitting element of each color.

Hereinafter, a case of three colors of RGB will be described. However, the color combination is not limited to this as described above, and the following description can be appropriately applied to other color combinations.

The pixel array 102 is a set of the pixels 100, and for example, the pixels 100 are arranged in an array as shown in the drawing in a first direction and a second direction which is a direction intersecting the first direction. The first direction and the second direction intersect, for example, at a right angle, but may not be strictly at a right angle. Furthermore, in the present disclosure, the first direction and the second direction are described for convenience, and the arrangement of the pixels 100 and each component may be connected in a similar manner as in the embodiment. Hereinafter, a set of pixels 100 in the first direction may be referred to as a pixel line, and a set of pixels 100 in the second direction may be referred to as a pixel column.

The pixels 100 are connected to the selector circuits 20 via second signal lines 112, and are connected to the line control circuit 24 via line control lines 114.

The selector circuits 20 are connected to the light emission signal transmission circuit 22 via first signal lines 110. The selector circuit 20 includes, for example, a demultiplexer. One selector circuit 20 is connected to each of a predetermined number of pixel columns in the first direction. The predetermined number is, for example, four, but is not limited thereto, and may be smaller or larger.

All of the pixels 100 belonging to a pixel line are connected to one selector circuit 20 among the plurality of selector circuits 20. In a case where the number of pixels 100 belonging to the pixel line cannot be divided by the predetermined number, the number of connections may be made smaller than the predetermined number in any of the selector circuits 20. Furthermore, in a case where there is a pixel 100 that is not effectively used in the pixel array 102, for example, in a case where there is a pixel outside the effective display region, the pixel 100 may not be connected.

In FIG. 2, the selector circuits 20 are connected to each of the pixels 100 and one first signal line 110, but this will be omitted. The first signal lines 110 are connected to light emitting units for each color included in the pixel 100. In practice, the first signal lines 110 are connected to the R light emitting unit, the G light emitting unit, and the B light emitting unit of each pixel 100. That is, in the drawing, one selector circuit 20 is connected to twelve second signal lines 112, and these twelve second signal lines 112 are connected to four pixels 100 three by three.

The light emission signal transmission circuit 22 controls a signal of each color of the pixels 100 that emit light for each line. The light emission signal transmission circuit 22 gives a light emission signal to the pixel array 102 in time series, and outputs the light emission signal to the pixels 100 of the pixel lines electrically connected by the line control circuit 24 that will be described later. The light emission signal transmission circuit 22 includes, for example, an amplifier that amplifies a signal to be output to each selector circuit 20. By dividing the light emission signals provided to the plurality of pixels 100 in time series by the selector circuits 20, the number of amplifiers can be reduced.

The signal from the light emission signal transmission circuit 22 is time-divided by the selector circuits 20 and applied to the pixels 100 belonging to each column. The selector circuits 20 select the pixel columns in the order related to the time division. That is, the light emission signal transmission circuit 22 applies a signal to be applied to each pixel 100 as a time-series signal, and the selector circuit 20 applies the time-series signal to an appropriate column.

In other words, the light emission signal transmission circuit 22 applies a time-series signal to a signal line, and this signal line is connected to the light emitting unit of the pixel to perform emission via the selector circuit 20. Then, the selector circuit 20 appropriately divides the time, selects a signal line for applying a signal to the column in which the light emitting unit of the pixel exists, and distributes the signal. The selector circuit 20 distributes the time-series light emission signals to the light emitting unit of each color of each pixel by the predetermined number x the number of colors of the second signal lines 112.

More precisely, the selector circuit 20 distributes the light emission signal to the second signal line 112 for the column to which the light emitting unit of the color to be emitted by the pixel 100 belongs.

The line control circuit 24 controls a line to which the light emission signal is applied. The line control circuit 24 is connected to pixels belonging to each line via a line control line 114 for each line.

Figure 3:
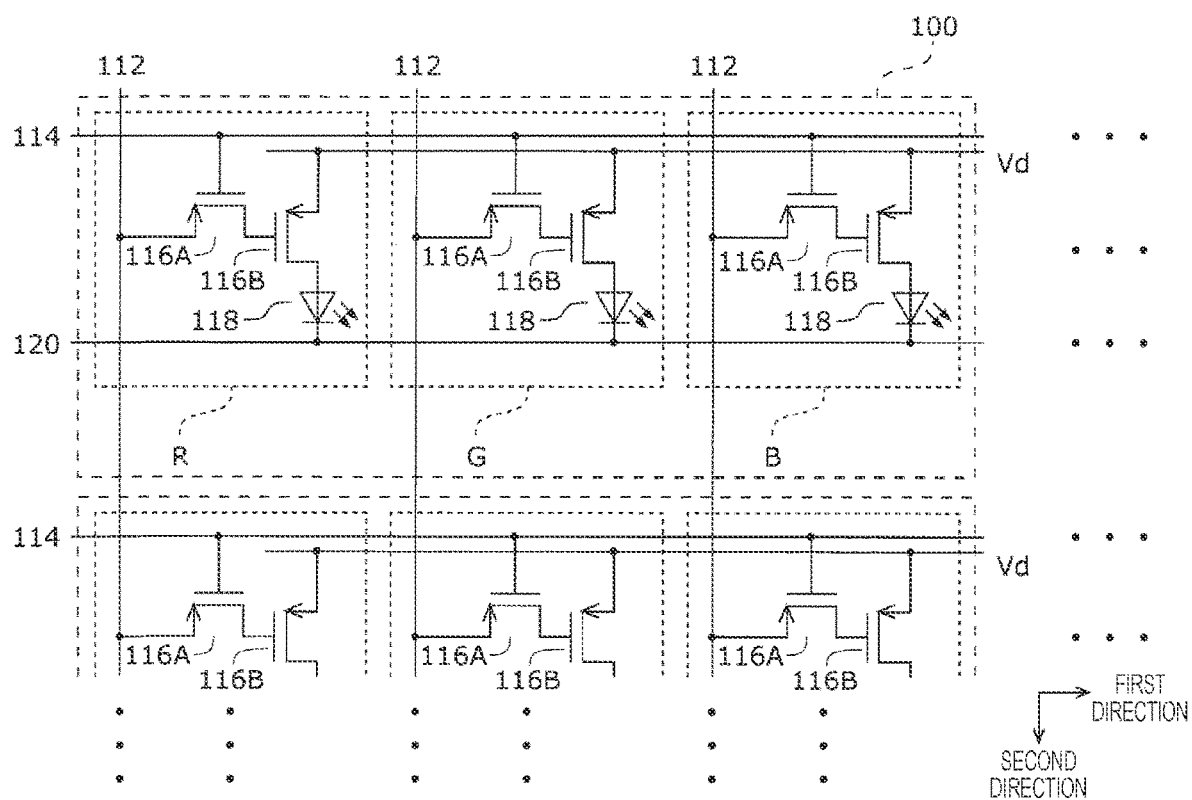
FIG. 3 is a diagram schematically showing connection of pixels according to the embodiment.

FIG. 3 is a diagram schematically showing connection of pixels according to the embodiment. It should be noted that FIG. 3 merely illustrates the connection relationship, and the arrangement and the like of the light emitting units are not limited to this drawing. For example, a switch for discharging the held charge at a predetermined timing, a capacitor for maintaining a potential difference between any terminals, a switch for applying a power supply voltage at a predetermined timing, or the like may be separately provided.

The pixels 100 include, for example, light emitting units R, G, and B corresponding to the respective colors. Each light emitting unit includes switches 116A and 116B and a light emitting element 118. For example, the light emitting unit R corresponds to a light emitting unit that emits red light, the light emitting unit G corresponds to a light emitting unit that emits green light, and the light emitting unit B corresponds to a light emitting unit that emits blue light.

A second signal line 112 and a line control line 114 are connected to each light emitting unit. Moreover, a reference power supply line 120 is connected. The reference power supply line 120 is, for example, a signal line that is connected to a voltage corresponding to the ground level of the power supply voltage and allows a current based on the intensity of light emission to flow properly to the light emitting element 118.

The switch 116A includes, for example, a p-type MOSFET. The line control line 114 is connected to the gate of the switch 116A, and the second signal line 112 is connected to the source of the switch 116A.

The switch 116B includes, for example, a p-type MOSFET. The drain of the switch 116A is connected to the gate of the switch 116B. Furthermore, the source of the switch 116B is connected to, for example, a controlled voltage Vd. The voltage Vd is, for example, a power supply voltage controlled to be applied at a timing when the light emitting element 118 emits light.

The light emitting element 118 includes, for example, an M-OLED element. The light emitting element 118 emits light of a color required in the pixel 100. The drain of the switch 116B is connected to, for example, the anode of the light emitting element 118, and the cathode of the light emitting element 118 is connected to the reference power supply line 120. With such a connection, the drain current of the switch 116B flows to the reference power supply line 120 via the light emitting element 118. Therefore, the light emitting element 118 outputs light having intensity according to the drain current of the switch 116B.

The pixels 100 output red, green, and blue light from the light emitting elements 118 provided in each of the light emitting units R, G, and B. Luminance and color of the pixel 100 are formed by the intensity of these lights, and light as a pixel is output from the display panel 10.

The line control circuit 24 applies a voltage exceeding a threshold voltage to each line, selects a line in accordance with time series, and controls the voltage applied to the gate of the switches 116A of each light emitting unit of the pixels 100 belonging to the line to a voltage equal to or lower than the threshold voltage. As a result, in the pixel belonging to the line selected by the line control circuit 24, a voltage based on the drain current of the switch 116A is applied to the gate of the switch 116B by the signal value provided to the second signal line 112. When the voltage Vd is applied in a state where the voltage based on the signal value is applied to the gate of the switch 116B, the drain current of the switch 116B is input to the light emitting element 118. The light emitting element 118 emits light on the basis of the intensity of the drain current. The selector circuit 20 distributes the time-series light emission signals output from the light emission signal transmission circuit 22 to the appropriate second signal line 112, that is, selects a light emitting unit of an appropriate color of an appropriate column.

As described above, the pixels 100 appropriately emit light by the control signal in the line direction output from the line control circuit 24 and the light emission signal in the column direction, which is output from the light emission signal transmission circuit 22 and distributed by the selector circuit 20.

Note that, in FIG. 3, only the minimum configuration is shown, and the specific configuration of the pixel 100 is not limited thereto. More detailed drawings and descriptions in the case of using the OLED will be described later. The pixel 100 may include, for example, various capacitors, resistors, switches for reset control, floating control, or other voltage control, or the like as necessary, and the switches 116A and 116B may be n-type instead of p-type, or may not be MOSFETs. For example, the voltage to be applied or the like is appropriately changed by changing the signal based on the pixel value applied to the second signal line 112 according to the conductivity type of the switch 116B.

That is, the light emitting element may be configured to appropriately emit light on the basis of the control signal for the line and the light emission signal for the column. In addition, the configuration of the signal line for the column is not limited thereto. For example, a control line equivalent to the line control line may be applied from the selector circuit 20, and a separately applied light emission signal may be distributed by the line control line. In this case, each light emitting unit may further include a switch or the like.

Figure 4:
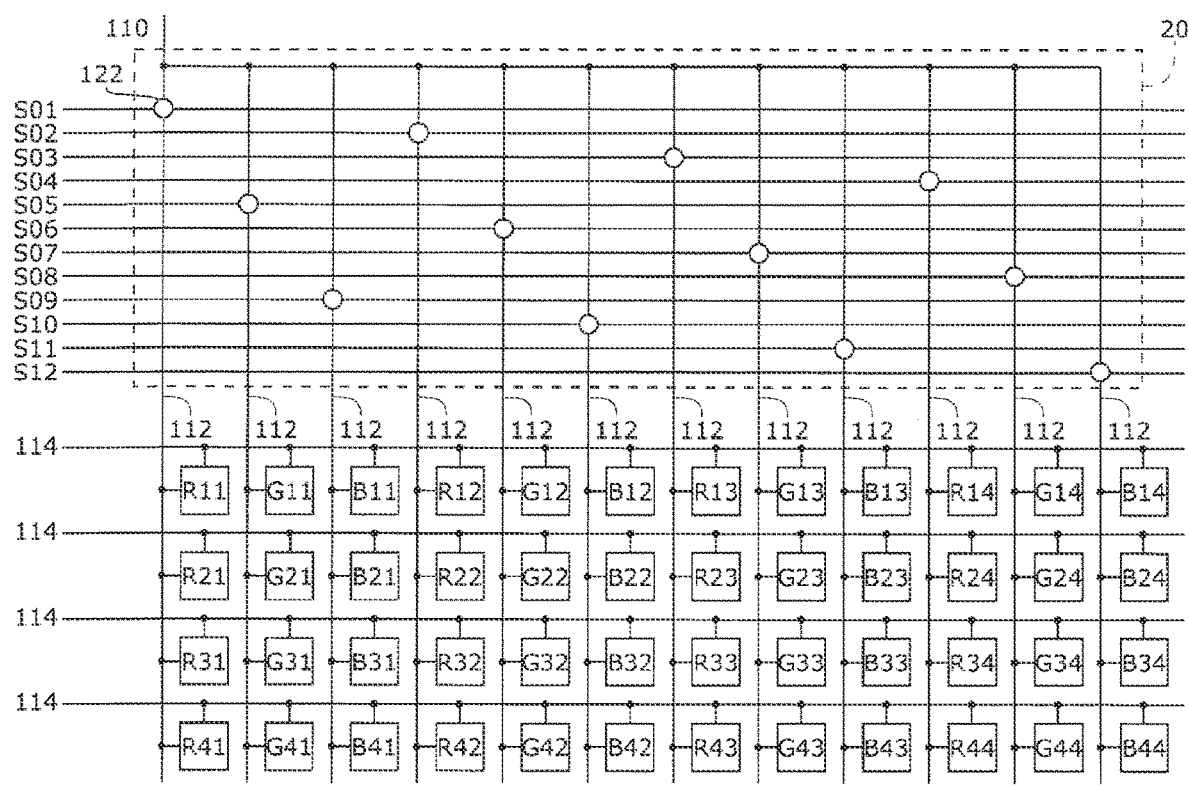
FIG. 4 is a diagram schematically showing connection of a selector circuit according to the embodiment.

FIG. 4 is a diagram showing an example of connection between the selector circuit 20 and the light emitting unit of the pixel 100 according to the embodiment. R11, G11, B11, . . . shown at the lower part indicate light emitting units in the pixel 100. For example, R11 is a red light emitting unit of the pixel 100 of the pixel number 11, G11 is a green light emitting unit of the pixel 100 of the pixel number 11, and B11 is a blue light emitting unit of the pixel 100 of the pixel number 11.

As described above, the selector circuit 20 is connected to one first signal line 110 and (predetermined number) x (number of colors) second signal lines 112. Furthermore, the selector circuit 20 is further connected to, for example, (predetermined number) x (number of colors) column control lines S01, S02, ..., and S12. The column control line may be connected to a column control circuit (not shown). Since the control by the column control line is described as an example of the connection of the selector circuit 20, the present disclosure is not limited to this aspect. For example, the selector circuit 20 may have another configuration that functions as a demultiplexer.

Note that not all pixels have the same number of colors. In a case where the number of colors is not the same in all the pixels, the selector circuit 20 is connected to the appropriate number of second signal lines 112 and the appropriate number of column control lines.

The first signal line 110 is branched and connected to the plurality of second signal lines 112 inside the selector circuit 20.

Each of the second signal lines 112 is connected to one column control line via the column switch 122. For example, the leftmost second signal line 112 in the drawing is connected to the column control line S01 via the column switch 122, and the second signal line 112, which is the second from the left, is connected to the column control line S05 via the column switch 122. As described above, in one selector circuit 20, one second signal line 112 is exclusively connected to any one of one column signal line via the column switch 122. Note that this example is shown as an example, and for example, a configuration connected to the column control lines S01, S02, S03, ... in the order of R, G, and B of the pixels of 11, ... may be employed.

The column switch 122 includes, for example, a MOS-FET. When a voltage necessary for driving the column switch 122 is applied to the column control line, the column switch 122 is turned on, and the signal from the first signal line 110 via the column switch 122 is distributed to the pixel column via the second signal line 112. Then, on the basis of the voltage applied to the line control line 114, the light emitting unit of an appropriate color of the pixel 100 at an appropriate position emits light.

As described above, on the basis of the line control signal applied to the line control line 114 and the column control signal applied to the column control line, the light emission signals provided in time series from the light emission signal transmission circuit 22 can be distributed to appropriate light emitting units at appropriate timing.

Note that the connection between the column control line and the second signal line in FIG. 4 is given as an example, and the connection is not limited thereto.

The connection shown in FIG. 4 is realized for each selector circuit 20. That is, in a case where a plurality of selector circuits 20 is provided, the selector circuits 20 of FIG. 4 are further provided for different pixel column groups. In addition, only four lines of pixels are shown, but only the necessary number of pixel lines are provided below the four lines. Furthermore, depending on a method, the pixel 100 may be divided into two or more line groups, and in this case, for example, the line control circuit 24 and the selector circuit 20 may be provided in each of the pixel lines of the upper half and the lower half of the display panel 10.

In FIG. 4, for example, a pixel line including the pixel 100 having the light emitting units R11, G11, B11, ... is set as a first line, a pixel line including the pixel 100 having the light emitting units R21, G21, B21, ... is set as a second line, and the like.

For example, with m as a non-negative integer, the selector circuit 20 distributes the light emission signal to the second signal line 112 in different orders for the (2m+1)th line and the (2m)th line. For example, the selector circuit 20 distributes (first-distributes) the light emission signal for the odd-numbered line ((2m+1)th line) in a first order, and distributes (second-distributes) the light emission signal for the even-numbered line ((2m)th line) in a second order.

For example, in the pixel line including the pixel 100 having the light emitting units R11, G11, B11, ... and the pixel line including the pixel 100 having the light emitting units R31, G31, B31, ..., the light emission signals are first-distributed in the same first order. Then, in the pixel line including the pixel 100 having the light emitting units R21, G21, B21, ... and the pixel line including the pixel 100 having the light emitting units R41, G41, B41, ..., the light emission signals are second-distributed in the same second order (order different from the first order).

As will be described later, the first order and the second order have the same order for each color, but the distribution order of pixels in the color is different. For example, in the first order and the second order, the light emission signals are commonly distributed in the order of red for four pixels, green for four pixels, and blue for four pixels. Then, in each order, the order of the pixels 100 in each color is the same.

For example, in the first order, distribution is performed in the order of Rn1, Rn2, Rn3, Rn4, Gn1, Gn2, Gn3, Gn4, Bn1, Bn2, Bn3, and Bn4. On the other hand, in the second order, distribution is performed in the order of Rn4, Rn3, Rn2, Rn1, Gn4, Gn3, Gn2, Gn1, Bn4, Bn3, Bn2, and Bn1. As described above, the order of the respective colors and the distribution order of the pixels in the respective colors are the same order common over the first order and the second order. Furthermore, the selection order of the colors in the first order and the second order is also the same in each distribution. On the other hand, the selection order of the pixels of the respective colors in the first order and the second order is different. For example, in the above example, while the pixels are distributed in the order of 1, 2, 3, and 4 in the first order, the pixels are distributed in the order of 4, 3, 2, and 1 in the second order.

That is, as an example, in the first distribution and the second distribution, the light emission signal is commonly distributed in the order of R, G, and B. The light emission signals of the pixels 100 corresponding to the selector circuit 20 are distributed for each determined color order. For example, the light emission signals are distributed in the order of four pixels of R, four pixels of G, and four pixels of B. The order among Rs, the order among Gs, and the order among Bs are the same in each line. For each line, the first distribution or the second distribution in which distribution is performed in an order different from the first distribution is determined. For example, in the first distribution, the order of 1, 2, 3, and 4 is applied to each color, and in the second distribution, the order of 4, 3, 2, and 1 is applied.

Figure 5:
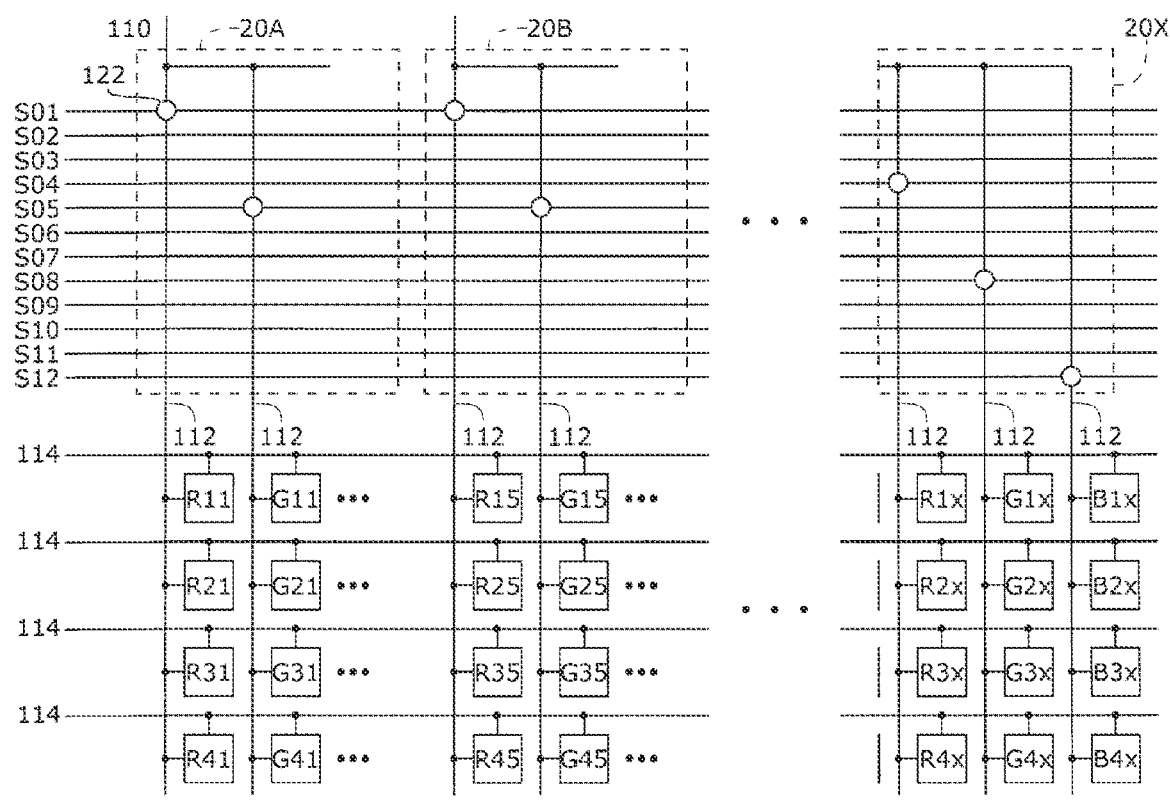
FIG. 5 is a diagram schematically showing connection of the selector circuit according to the embodiment.

FIG. 5 is a diagram showing a connection example in a case where there is a plurality of selector circuits 20. For example, FIG. 5 shows a case where the number of pixels 100 is x (the number of light emitting units is 3×x) in each pixel line. Furthermore, it is assumed that light emitting units of four-pixel columns, that is, twelve columns are connected to each selector circuit 20.

In a case where there is a plurality of selector circuits 20, the light emission signals are distributed to the same line in the same order as the first order or the second order. By similarly forming the connection among each column control line, the second signal line 112 of the selector circuit 20, and the light emitting units of each color of the pixels 100, light emission can be performed in the same order in each selector.

For example, the selector circuit 20B is connected with the fourth pixel column to the seventh pixel column. In this case, similarly to the selector circuit 20A, the selector circuit 20B distributes the light emission signal for the odd-numbered pixel line in the order of Rn5, Rn6, Rn7, Rn8, Gn5, Gn6, Gn7, Gn8, Bn5, Bn6, Bn7, and Bn8 according to the first order. On the other hand, the selector circuit 20B distributes the light emission signal for the even-numbered pixel line in the order of Rn8, Rn7, Rn6, Rn5, Gn8, Gn7, Gn6, Gn5, Bn8, Bn7, Bn6, and Bn5 according to the second order. As described above, in the same pixel line, each selector circuit 20 distributes the light emission signal in the same first order or second order for each predetermined number of pixels 100.

This distribution is transmitted to a column of an appropriate light emitting unit by turning on/off the column switch 122 by the column control lines S01, . . . , and S12. For example, a column control circuit (not shown) applies a column control signal for an even-numbered line and an odd-numbered line to a column control line, and thus control of the line and control of distribution for each column are synchronized. That is, the column control circuit outputs a control signal for determining the order of distribution in the selector circuit 20 to the column control line in synchronization with the line control of the line control circuit 24. This control signal is switched at the same interval as the switching interval of the light emitting unit in the light emission signal.

In summary, the light emission signal is transmitted from the light emission signal transmission circuit 22. This light emission signal is a signal provided in time series for each line and for each selector circuit 20. The line control circuit 24 applies a control signal for turning on the pixel line synchronized with the light emission signal to the appropriate line control line 114. The selector circuit 20 executes distribution according to the first order or the second order on the basis of the control signal of the column control line, on the basis of the signal from the column control line to which the appropriate column control signal is applied.

In this manner, the light emission signals are distributed to appropriate lines in an appropriate order. In a case where the process proceeds to the process of the next line, the similar process as described above is repeated. That is, the pixel line first-distributed in the first order and the pixel line second-distributed in the second order are alternately arranged, and the selector circuit 20 properly distributes the light emission signal at the timing when the lines are turned on.

Note that, in the above description, the same selector circuit 20 is used for the odd-numbered lines and the even-numbered lines, but the present invention is not limited thereto. For example, the selector circuits 20 for the odd-numbered lines and the even-numbered lines may be respectively provided. In this case, the light emission signal transmission circuit 22 may switch the selector circuit 20 that outputs the light emission signal in synchronization with the line control circuit 24. Furthermore, an example in which the number of the light emission signal transmission circuits 22 is one has been described, but the present invention is not limited thereto, and various arrangements may be adopted, for example, a configuration in which the pixel array 102 is divided into two in the second direction and the light emission signal transmission circuits 22 are provided for each of the two, or another division may be adopted. In such a case, the selector circuit 20 is appropriately provided.

Although the connection and control of the light emission signals in the pixels existing in the display panel 10 have been described above, next, the distribution of the light emission signals of the light emitting units, that is, the first distribution according to the first order and the second distribution according to the second distribution will be described in detail. In the following description, selection of a line and a column is realized by the selector circuit 20 and the like in the above description. In addition, the aspect of the present disclosure is not limited to the above description, and may be implemented by a device or the like capable of executing an operation similar to that described above.

Figure 6:
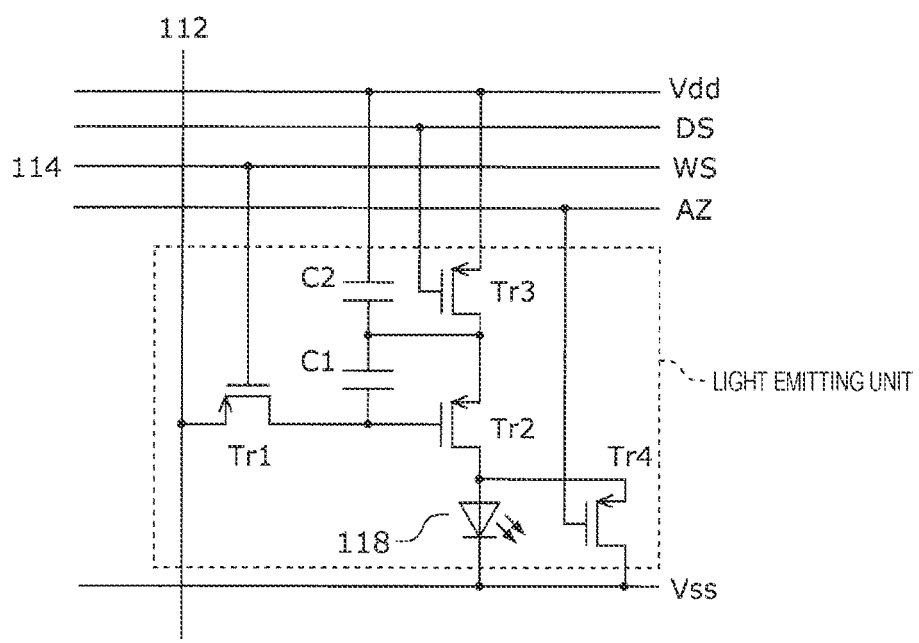
FIG. 6 is a view schematically showing a light emitting unit according to the embodiment.

In FIG. 3 described above, the light emitting unit has been described very simply, but here, the light emitting unit will be described in more detail. FIG. 6 is a circuit diagram schematically showing a light emitting unit using an OLED (including an M-OLED) according to the embodiment.

The light emitting unit for each color of the pixels 100 includes the light emitting element 118, transistors Tr1, Tr2, Tr3, and Tr4, and capacitors C1 and C2.

The light emitting element 118 is an element that emits light of each color output from the pixel 100, and is, for example, a current-driven type electro-optical element in which light emission luminance changes according to a current value flowing through the device, such as an OLED and an M-OLED. The light emitting element 118 has an anode connected to the drain of the transistor Tr2 and a cathode connected to the ground level of the power supply voltage.

The transistor Tr1 is a sampling element corresponding to the switch 116 in FIG. 3, and is a transistor that controls the transistor Tr2 that drives the light emitting element 118 to allow an appropriate current to flow based on the light emission signal. The transistor Tr1 is, for example, a p-type MOSFET, and has a source connected to the second signal line 112 and a gate connected to the line control line 114.

The transistor Tr2 is an element that controls a current for driving the light emitting element 118. The transistor Tr2 is, for example, a p-type MOSFET, and has a gate connected to the drain of the transistor Tr1 and a drain connected to the anode of the light emitting element 118.

The transistor Tr3 is an element that controls light emission of the light emitting element 118. The transistor Tr3 is, for example, a p-type MOSFET, and has a gate connected to the first driving scanning line, a source connected to the power supply voltage, and a drain connected to the source of the transistor Tr2.

The transistor Tr4 is an element that switches a current for the light emitting element 118 to emit light. The transistor Tr4 is, for example, a p-type MOSFET, and has a gate connected to the second driving scanning line, a source connected to the drain of the transistor Tr2, and a drain connected to the ground level of the power supply voltage.

The capacitor C1 is a capacitor that holds the voltage applied from the second signal line 112. The capacitor C1 is connected between the gate and the source of the transistor Tr2.

The capacitor C2 is a capacitor that suppresses variation of the potential of the source of the transistor Tr2 at the timing when the capacitor C1 holds the voltage applied from the second signal line 112. Furthermore, in the capacitor C2, the voltage between the gate and the source of the transistor Tr2 is maintained at the threshold voltage. The capacitor C2 is connected between the source and the drain of the transistor Tr3.

With such a configuration, by lowering the potential difference between the gate and the source of the transistor Tr2 to the threshold voltage by self-discharge, the time for setting a voltage WS of the second signal line 112 to Low can be shortened. Then, the timing at which the light emission signal is provided to the source of the transistor Tr2 to which the light emission signal is provided can be advanced. As a result, the intensity value of the light emission signal can be accurately transmitted to the luminance at which the light emitting element 118 emits light.

Figure 7:
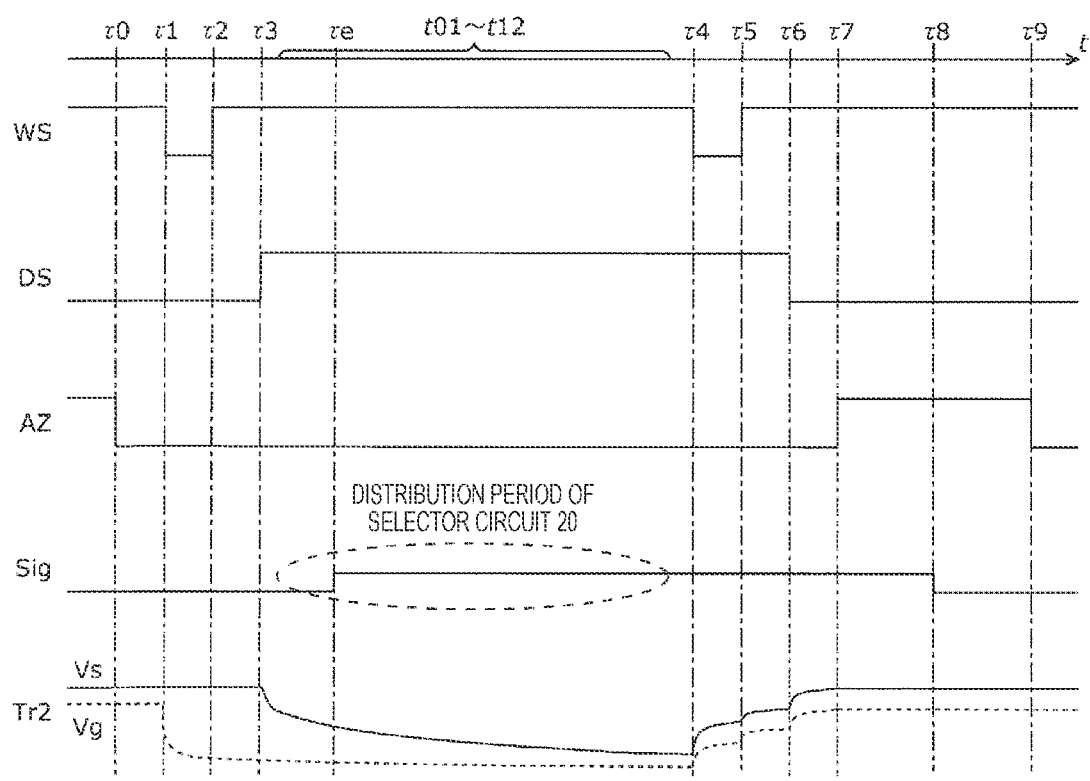
FIG. 7 is a diagram showing a transition of a potential according to the embodiment.

FIG. 7 is a timing chart showing at what timing a voltage is applied to the light emitting unit in FIG. 6. The description at the upper part is a description representing time, and the graph indicates what voltage is applied to each signal line or each terminal with respect to time. Note that, for the sake of description, the transition of time is shown so as to be easy to understand, but the time interval is not the ratio shown in this drawing, and is assumed to be switched at an appropriate time depending on the environment of the device or the like.

Time t=τ0 to τ9 is one cycle of the line control in a case where the selector circuit 20 is used, for example. Before the time t=τ0, the potentials of the source and the gate of the transistor Tr2 are respectively controlled to the initialized potential or the potential in the previous cycle. Then, the voltage WS applied to the line control line 114 is controlled to the High level, a voltage DS applied to the first driving scanning line is controlled to the Low level, a voltage AZ applied to the second driving scanning line is controlled to the High level, and a signal applied to the second signal line 112 is controlled to the Low level.

At time t=τ0, the voltage AZ changes from High to Low, the transistor Tr4 is turned on, and switching is performed such that a current does not flow through the light emitting element 118.

At time t=τ1, the voltage WS changes from High to Low, the transistor Tr1 is turned on, and the reference level of Sig is written in the gate of the transistor Tr2. Since the voltage DW is Low, the transistor Tr3 is turned on, the voltage between the gate and the source of the transistor Tr2 is maintained in the capacitor C1, and a current flows from Vdd to Vss via the transistor Tr4 that is turned on.

At time t=τ2 after the writing to the gate of the transistor Tr2 is sufficiently executed, the voltage WS changes from Low to High. Here, the voltage Sig distributed from the selector circuit 20 later is prevented from being sequentially applied to the gate of the transistor Tr2. Therefore, the potential distributed by the selector circuit 20 is stored in the second signal line 112 connected to each light emitting unit until the voltage WS becomes Low next time.

At time t=τ3, the voltage DS changes from Low to High, and the transistor Tr3 is turned off. Although the voltage between the gate and the source of the transistor Tr2 is maintained by the capacitors C1 and C2, both potentials are gradually lowered from this timing by natural discharge.

At time t=τe, the voltage of the light emission signal is applied from the selector circuit 20 to the second signal line 112. As described above, since the transistor Tr1 is turned off, this voltage is maintained in each of the second signal lines 112. This τe is, for example, any timing of times t01 to t12 described later. That is, at a time indicated by a broken line in the drawing, the selector circuit 20 distributes the light emission signal provided in time series to the light emitting units of the predetermined number of pixels 100.

After a sufficient time elapses after the distribution by the selector circuit 20 is completed, the voltage WS changes from High to Low at time t=τ4, the transistor Tr1 is turned on, and the light emission signal Sig distributed to each light emitting unit is applied to the gate of the transistor Tr2. When a sufficient time elapses, the potential difference of the light emission signal is held between the gate and the source of the transistor Tr2 by the capacitor C1.

At time t=τ5, the voltage WS changes from Low to High, and the transistor Tr1 is turned off. The voltage between the gate and the source of the transistor Tr1 is held by the capacitor C1 in a similar manner as described above.

At time t=τ6, the voltage DS changes from High to Low, and the transistor Tr3 is turned on. When the transistor Tr3 is turned on, a current flows between the power supplies via the transistor Tr4, while the voltage distributed by the selector circuit 20 to the transistor Tr2 is maintained via the capacitor C1.

At time t=τ7, the voltage AZ changes from Low to High, and the transistor Tr4 is turned off. When the transistor Tr4 is turned off, the flow of the current is switched to the light emitting element 118, and the current based on the voltage between the gate and the source of the transistor Tr2 flows from the anode to the cathode of the light emitting element 118. As a result, light having luminance according to the light emission signal distributed by the selector circuit 20 is emitted from the light emitting element 118.

At time t=τ8, the voltage of the second signal line 112 is reset and lowered to the reference voltage.

Then, from the time t=τ9 (=τ0), similar processing is repeated in the next line.

By controlling the configuration as shown in FIG. 6 and the voltage as shown in FIG. 7, the light emission based on the light emission signal provided to the second signal line 112 can be controlled by correcting variations and the like in the characteristics of the transistor Tr1 and shortening the ON time of the transistor Tr1 due to the voltage WS.

When control is performed with such a structure, and further, when the light emission signal is distributed by the selector circuit 20, the influence on the adjacent light emitting units at the timing when the second signal line 112 is turned on by the selector circuit 20 cannot be ignored. This is because the voltage between the gate and the source of the transistor Tr2 is lowered to the threshold voltage Vth by self-discharge. That is, in a case where the source voltage Vs is affected to be lowered by the influence from the signal line connected to the adjacent pixel, there is a possibility that the voltage between the gate and the source is lower than the threshold voltage Vth. In a case where the voltage becomes lower than the threshold voltage Vth in this manner, it is conceivable that the intensity of the signal held in the capacitor C1 decreases at the time t=τ4 to τ5. In the present embodiment, in order to reduce the influence of the entire image displayed on the display panel 10, distribution control by the selector circuit 20 is performed as described below.

FIGS. 8, 9, 10, 11, and 12 are diagrams showing an example of distribution of light emission signals according to the embodiment. In the following description, for example, a case where one selector circuit 20 distributes the light emission signal for four pixel columns will be considered. Furthermore, the number of pixels 100 corresponding to the selector circuit 20 of interest is 1 to 4. Furthermore, it is assumed that the number of lines of interest is 1 and 2, the pixels 100 belonging to the line number 1 are first-distributed, and the pixels 100 belonging to the line number 2 are second-distributed. In the drawing, for example, Rxy represents a red light emitting unit of a y-th pixel of an x-th line.

The connection between the selector circuit 20 and the column control line and the method of attaching the reference sign of the light emitting unit in each pixel 100 are on the basis of FIG. 4 or 5. The region indicated by the dotted line is a light emitting unit of the pixel 100 distributed by the light emission signal output from the selector circuit arranged before and after the selector circuit 20 of interest.

The description at the upper part is the number of the light emitting units, and the description at the lower part is the order in which the light emission signals are distributed to the light emitting unit. The lower part shows a time series (from t01 to t12) from top to bottom, as shown at the left end. This time is the time shown in FIG. 7. In addition, the description next to the time series is a reference sign of a column control line on which a signal for turning on the column switch 122 is controlled.

FIG. 8 is a diagram showing an example of the selection order of the light emitting units of the pixels 100 in the first distribution. In the first distribution, as shown in the drawing, time-series signals are distributed in the order of R11, R12, R13, R14, G11, G12, G13, G14, B11, B12, B13, and B14. Therefore, a signal for turning on the column switch 122 is applied to the column control line in the order of S01, S02, S03, S04, S05, S06, S07, S08, S09, S10, S11, and S12, and light emission signals provided in time series such that the light emitting units emit light in the above order in time series are appropriately distributed.

Arrows shown in the drawing are diagrams showing influences of a voltage, a current, and the like on adjacent light emitting units. When a light emission signal is applied to the adjacent light emitting units later, the light emission intensity changes although slightly under the influence of the later application. On the other hand, in the light emitting unit to which the light emission signal is distributed later, the previous influence is canceled at the timing when the light emission signal is applied.

Therefore, as in the present embodiment, by causing the light emitting units to emit light for each color in the distribution of the light emission signal, a luminance difference for each color occurs in each pixel 100, but it is possible to perform control while suppressing the influence from the adjacent light emitting units of the pixel 100 itself. For example, when light is emitted as in R11, G11, B11, . . . , only R11 is significantly affected, a luminance difference occurs for each pixel 100, for example, the luminance of the pixel with the pixel number 1 is high and the other luminance is lower than that. As described above, by performing control for each color, such an influence can be avoided.

FIG. 9 is a diagram showing an example of the selection order of the light emitting units of the pixels 100 in the second distribution. In the second distribution, as shown in the drawing, time-series signals are distributed in the order of R24, R23, R22, R21, G24, G23, G22, G21, B24, B23, B22, and B21. Therefore, a signal for turning on the column switch 122 is applied to the column control line in the order of S04, S03, S02, S01, S08, S07, S06, S05, S12, S11, S10, and S09, and light emission signals provided in time series such that the light emitting units emit light in the above order in time series are appropriately distributed.

As a result, for example, when the second distribution has a distribution order similar to that of the first distribution, Rn1 is affected by Gn1 and Bn0, respectively, and the change in luminance becomes larger than that of the red light emitting units existing in the other columns. For this reason, when viewed as the entire screen, columns with bright or dark luminance exist in a streak shape. On the other hand, when the second distribution is performed in the reverse order for each color as shown in FIG. 9 with respect to the first distribution in FIG. 8, the light emitting units having the brighter luminance are alternately present for each line, and the change in the streak-like luminance can be suppressed.

Furthermore, as compared with the case where the second distribution is performed in the order of B24, B23, . . . , R22, and R21 in which all orders are reversed without taking the colors into consideration, the change in color tone for each line can also be suppressed by making the order of colors the same as described above. For example, according to the comparative example in which the order is simply reversed, the luminance difference between R11 and B14 becomes the luminance difference between B24 and R11 in the next column, and a large luminance difference occurs for each color. On the other hand, according to the present embodiment, what should be considered is the luminance difference between R11 and R14 and the luminance difference between R24 and R21 in which the order is reversed, and the influence for each color can be suppressed to be small as the order of colors is also switched.

Similarly, FIG. 10 is also a diagram showing the second distribution. Instead of reversing the order for each color, for example, the order may be cyclically shifted every two pixels. That is, for R11, R12, R13, and R14, R23, R24, R21, and R22 may be set. Also in this form, it is possible to display more natural for human eyes than in the comparative example.

Note that, although the shift amount is two pixels, the shift amount is not limited to two pixels. For example, in a case where the selector circuit 20 distributes light emission signals for k pixels more than 4 pixels, the order may be shifted by floor (k/2) pixels. Here, floor (•) represents a floor function. This is also equivalent to switching the order of floor (k/2) pixels in the first half of the distribution and ceil (k/2) pixels in the second half. Here, ceil (•) represents a ceiling function. Of course, even in the case of k pixels, the order may be shifted every two pixels.

Furthermore, the present invention is not limited to these examples, and distribution in which the order is switched to any order different from that of the first distribution within the same color may be the second distribution.

FIG. 11 is a diagram showing another example of the first distribution. In this example, the first distribution is R11, R13, R12, R14, . . . , B14. In this manner, in the same distribution, an order may be set such that the lines are not scanned in a raster manner.

FIG. 12 is a diagram showing an example of the second distribution with respect to the first distribution shown in FIG. 11. In this example, the second distribution is R24, R22, R23, R21, . . . , B21. This is also obtained by reversing the order in the same color. As in these examples, in the selector circuit 20, the selection order of the pixels 100 may not have to be raster.

As described above, according to some present embodiments of the present disclosure, it is possible to realize a display device in which color reproducibility is improved and characteristics of a transistor that executes line control are corrected. This is implemented by switching the distribution order of the odd-numbered lines and the even-numbered lines in a predetermined selection order. It is possible to reduce a change in luminance appearing in a column shape by alternately changing the order of the lines. In addition, a change in color tone for each line can be suppressed. The reason why the order of the pixels that emit light in different colors is the same is to avoid the color tone in the pixel 100 from being different from the color tone of the light emission signal.

Note that, in the above description, the order is RGB, but the present invention is not limited thereto, and for example, the order may be BGR or another order. Furthermore, although the case as shown in FIG. 7 has been described in detail, even when a simple light emitting unit or a more complicated light emitting unit is included as shown in FIG. 3, in a case where a change in luminance occurs due to a signal distributed to an adjacent light emitting unit, the selector circuit 20 may distribute the light emission signal in the order of the present disclosure. In this case, the similar effect can be obtained.

The embodiment described above may have the following forms.

(1) A display device including:

pixels including a plurality of light emitting units that emits light of each of a plurality of colors;

a pixel array in which the pixels are arranged in an array of pixel lines along a line in a first direction and pixel columns along a column in a second direction intersecting the first direction;

a signal line connected to the pixels belonging to the pixel array in the second direction; and a selector circuit connected between a predetermined number of the pixel columns and the signal line, in which the signal line applies, via the selector circuit, a light emission signal provided in time series to the light emitting units of each color of the pixels, the selector circuit time-divides the light emission signal provided in time series from the signal line into the predetermined number of columns, the light emission signal is distributed to the pixels in the same order for each color in the same order in the same pixel line, and the light emission signal is distributed to the pixels in different orders for each line for each color in the same order in two adjacent pixel lines.

(2) The display device described in (1), further including:

a line control circuit that is connected to the pixel of each of the pixel lines and applies a line control signal that controls light emission of the pixel line to the pixel line, in which the pixel emits light on the basis of the line control signal and the light emission signal distributed by the selector circuit.

(3) The display device described in (1) or (2), in which the selector circuit executes first distribution in which the light emission signal is distributed in a first order and second distribution in which the light emission signal is distributed in a second order different from the first order, an order of colors in the first order and an order of colors in the second order are the same, and a selection order of the pixels in the same color in the first order and a selection order of the pixels in the same color in the second order are different from each other.

(4) The display device described in (3), in which the selector circuit executes distribution such that the pixel lines to which the first distribution is performed and the pixel lines to which the second distribution is performed are alternately arranged.

(5) The display device described in (3) or (4), in which the first order is an order of selecting the pixels for all colors in the same order, and the second order is an order of selecting the pixels for all colors in the same order which is an order different from the first order.

(6) The display device described in (4), in which the second order is an order of selecting the pixels for each color in an order reverse to the first order.

(7) The display device according to (4), in which the second order is an order of selecting the pixels for each color in an order obtained by dividing the first order in two and switching the first and second parts.

(8) The display device described in (4), in which the second circuit is an order of selecting the pixels for each color in an order obtained by cyclically shifting the first order every two pixels.

(9) The display device described in (4), in which the second circuit is an order of selecting the pixels for each color in an order obtained by switching the first order in any manner.

Aspects of the present disclosure are not limited to the above-described embodiments, but include various conceivable modifications, and the effects of the present disclosure are not limited to the above-described contents. The components in each embodiment may be appropriately combined and applied. That is, various additions, modifications, and partial deletions can be made without departing from the conceptual idea and gist of the present disclosure derived from the contents defined in the claims and equivalents thereof.

REFERENCE SIGNS LIST

1 Display device
10 Display panel
100 Pixel
102 Pixel array
110 First signal line
112 Second signal line
114 Line control line
116 Switch
118 Light emitting element
120 Reference power supply line
122 Column switch
20 Selector circuit
22 Light emission signal transmission circuit
24 Line control circuit

The invention claimed is:

1. A display device, comprising:

pixels including a plurality of light emitting units configured to emit light of each of a plurality of colors;

a pixel array in which the pixels are arranged in an array of pixel lines in a first direction and pixel columns in a second direction intersecting the first direction;

a signal line connected to the pixels in the second direction; and a selector circuit connected between a specific number of the pixel columns and the signal line, wherein the signal line is configured to apply, via the selector circuit, a light emission signal in time series to the plurality of light emitting units of each color of the pixels, the selector circuit is configured to:

time-divide the light emission signal from the signal line into the specific number of the pixel columns, and execute first distribution in which the light emission signal is distributed in a first order for a first pixel line of the pixel lines and second distribution in which the light emission signal is distributed in a second order for a second pixel line of the pixel lines, the first pixel line is adjacent to the second pixel line, the second order is different from the first order, an order of colors in the first order and an order of colors in the second order are the same, and a selection order of the pixels in the first order is different from a selection order of the pixels in the second order for a same color of the plurality of colors.

2. The display device according to claim 1, further comprising a line control circuit connected to the pixels of each of the pixel lines, wherein
the line control circuit is configured to apply a line control signal to control light emission of each of the pixel lines, and
the plurality of light emitting units of the pixels are further configured to emit the light based on the line control signal and the light emission signal distributed by the selector circuit.

3. The display device according to claim 1, wherein the selector circuit is further configured to execute the first distribution for odd-numbered pixel lines of the pixel lines and the second distribution for even-numbered pixel lines of the pixel lines.

4. The display device according to claim 3, wherein the second order is an order of selecting the pixels for each color of the plurality of colors in an order reverse to the first order.

5. The display device according to claim 3, wherein the second order is an order of selecting the pixels for each color of the plurality of colors in an order obtained by dividing the first order in a first part and a second part, and switching the first part and the second part.

6. The display device according to claim 3, wherein the second order is an order of selecting the pixels for each color of the plurality of colors in an order obtained by cyclically shifting the first order every two pixels of the pixels.

7. The display device according to claim 3, wherein the second order is an order of selecting the pixels for each color of the plurality of colors in an order obtained by switching the first order.

8. The display device according to claim 1, wherein
the first order is an order of selecting the pixels for the plurality of colors in the same order, and
the second order is an order of selecting the pixels for the plurality of colors in the same order which is an order different from the first order.

* * * * *